United States Patent
He et al.

(10) Patent No.: US 12,361,904 B2
(45) Date of Patent: Jul. 15, 2025

(54) CONTROL SWITCH OF DRIVING CIRCUIT, ARRAY SUBSTRATE AND DISPLAY PANEL

(71) Applicants: MIANYANG HKC OPTOELECTRONICS TECHNOLOGY CO.,LTD, Mianyang (CN); HKC CORPORATION LIMITED, Shenzhen (CN)

(72) Inventors: Zhenghang He, Mianyang (CN); Baohong Kang, Mianyang (CN)

(73) Assignees: MIANYANG HKC OPTOELECTRONICS TECHNOLOGY CO., LTD, Mianyang (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/796,283

(22) PCT Filed: Dec. 31, 2021

(86) PCT No.: PCT/CN2021/143542
§ 371 (c)(1),
(2) Date: Jul. 29, 2022

(87) PCT Pub. No.: WO2022/206078
PCT Pub. Date: Oct. 6, 2022

(65) Prior Publication Data
US 2024/0185810 A1 Jun. 6, 2024

(30) Foreign Application Priority Data
Mar. 29, 2021 (CN) .......................... 202110332223.8

(51) Int. Cl.
G02F 1/133 (2006.01)
G02F 1/1362 (2006.01)
(Continued)

(52) U.S. Cl.
CPC .......... *G09G 3/36* (2013.01); *G02F 1/13306* (2013.01); *G02F 1/136286* (2013.01); *G02F 1/1368* (2013.01); *G09G 2300/0421* (2013.01)

(58) Field of Classification Search
CPC . G02F 1/13452; G02F 1/1368; G09G 3/3266; H01L 29/41733
See application file for complete search history.

(56) References Cited

U.S. PATENT DOCUMENTS

2004/0125250 A1* 7/2004 Park ...................... G02F 1/1368
349/43
2010/0084657 A1 4/2010 Tseng
(Continued)

FOREIGN PATENT DOCUMENTS

CN 103761939 A 4/2014
CN 103943055 A 7/2014
(Continued)

OTHER PUBLICATIONS

Xiaolan Li, the ISA written comments, Mar. 2022,CN.
(Continued)

*Primary Examiner* — Yuzhen Shen

(57) ABSTRACT

A control switch of a driving circuit, an array substrate, and a display panel are disclosed. The control switch includes a thin film transistor. In the thin film transistor, the electrode includes at least two source branches, and the drain electrode includes at least one drain branch. Each source branch directly connected to the source lead is a first source branch. Each drain branch adjacent to the first source branch is a first drain branch). An extension of each of the at least one source lead is located between the respective first drain branch and the source trunk.

13 Claims, 8 Drawing Sheets

(51) Int. Cl.
*G02F 1/1368* (2006.01)
*G09G 3/36* (2006.01)

(56) References Cited

U.S. PATENT DOCUMENTS

| | | | |
|---|---|---|---|
| 2010/0252826 A1* | 10/2010 | Yamazaki | H01L 29/518 |
| | | | 257/E29.296 |
| 2012/0037908 A1* | 2/2012 | Wu | H01L 33/16 |
| | | | 257/E21.414 |
| 2013/0201610 A1* | 8/2013 | Yamasaki | H05K 1/18 |
| | | | 361/679.01 |
| 2013/0270567 A1 | 10/2013 | Wu et al. | |
| 2016/0232866 A1* | 8/2016 | Cho | H03K 17/56 |
| 2016/0380064 A1 | 12/2016 | Park et al. | |
| 2019/0006477 A1* | 1/2019 | He | H01L 29/78696 |
| 2019/0296152 A1* | 9/2019 | Gu | H01L 29/41733 |
| 2020/0058242 A1 | 2/2020 | Liu et al. | |

FOREIGN PATENT DOCUMENTS

| | | |
|---|---|---|
| CN | 105140293 A | 12/2015 |
| CN | 105405852 A | 3/2016 |
| CN | 106992215 A | 7/2017 |
| CN | 108074902 A | 5/2018 |
| CN | 208521935 U | 2/2019 |
| CN | 112925135 Y | 6/2021 |

OTHER PUBLICATIONS

Xiaolan Li, the International Search Report, Mar. 2022, CN.
Li, Xiaolan, the ISA written comments, Mar. 2022, CN.
Li, Xiaolan, the International Search Report, Mar. 2022, CN.

\* cited by examiner

CONTROL SWITCH OF DRIVING CIRCUIT, ARRAY SUBSTRATE AND DISPLAY PANEL

CROSS-REFERENCE TO RELATED APPLICATIONS

This application is a United States national stage application of co-pending International Patent Application Number PCT/CN2021/143542, filed December 31. 2021, which claims the benefit and priority of Chinese patent application number CN2021103322238, entitled "Control Switch of Driving circuit, Array Substrate and Display Panel" and filed with China National Intellectual Property Administration on Mar. 29, 2021, the entireties of which are hereby incorporated herein by reference.

This application claims the benefit and priority of Chinese patent application number CN2021103322238, entitled "Control Switch of Driving circuit, Array Substrate and Display Panel" and filed with China National Intellectual Property Administration on Mar. 29, 2021, the entireties of which are hereby incorporated herein by reference.

TECHNICAL FIELD

This application relates to the field of display technology, and more particularly relates to a control switch of a driving circuit, an array substrate, and a display panel.

BACKGROUND

The statements herein are intended for the mere purpose of providing background information related to the present application and do not necessarily constitute prior art.

Nowadays, display technology is widely used in the display of televisions, mobile phones and the display of public information. There are a variety of display panels for displaying pictures, and they can display colorful pictures. More and more display panels, such as Thin Film Transistor-Liquid Crystal Displays (TFT-LCD), Organic Light Emitting Diode (OLED) displays, etc., need to use Gate Driver on Array (GOA) technology, in which the GOA circuits are integrated onto the array substrate in the display panel to realize the scanning and driving of the display panel, so that the product costs can be reduced in terms of materials cost and manufacturing process.

Typically, when manufacturing a GOA circuit, the source, drain and source leads in a thin film transistor are disposed in the same layer and formed by etching at the same time, but the problem of uneven etching is prone to occur during the etching process. Furthermore, as the degree of integration of GOA circuits is getting increasingly higher, the channel distance between the source and the drain is getting smaller and smaller, so when the etching is not uniform, the source lead will be easily connected to both the source and the drain, resulting in a short circuit between the source and the drain.

SUMMARY

The present application provides a control switch of a driving circuit, an array substrate, and a display panel, which can prevent the occurrence of a short circuit between a source electrode and a drain electrode caused by uneven etching of the driving circuit.

In order to achieve the above objective, the present application provides a control switch of a driving circuit, the control switch including a thin film transistor. The driving circuit further includes a source lead connected to the thin film transistor. The thin film transistor includes a source electrode, a drain electrode and a gate electrode, where the source electrode includes at least two source branches arranged in parallel, and a source trunk connecting the at least two source branches together, where the source branch directly connected to the source lead is a first source branch, and the first source branch is connected to an end of the source trunk. The drain electrode is arranged in the same layer as the source electrode, and includes at least one drain branch and a drain trunk connecting the at least one drain branch together. The at least one drain branch and the at least two source branches are arranged in parallel and alternately to form channels, and the drain branch arranged adjacent to the first source branch is a first drain branch. The gate electrode is arranged corresponding to the source electrode and the drain electrode. The extension line of the source lead is located between the first drain branch and the source trunk.

The present application further discloses an array substrate that includes a driving circuit, a source lead, and a scan line driven by the driving circuit. The driving circuit includes a control switch, the control switch including a thin film transistor. The thin film transistor includes a source electrode, a drain electrode and a gate electrode. The source electrode includes at least two source branches arranged in parallel, and a source trunk connecting the at least two source branches together, where the source branch directly connected to the source lead is a first source branch, and the first source branch is connected to an end of the source trunk. The drain electrode is arranged in the same layer as the source electrode, and includes at least one drain branch and a drain trunk connecting the at least one drain branch. The at least one drain branch and the at least two source branches are arranged in parallel and alternately to form channels, and the gate is arranged corresponding to the source electrode and the drain electrode. The source branch directly connected to the source lead is a first source branch, and the drain branch arranged adjacent to the first source branch is a first drain branch. The gate electrode is arranged corresponding to the source electrode and the drain electrode. The extension line of the source lead is located between the first drain branch and the source trunk.

The present application further discloses a display panel, including an array substrate, a color filter substrate disposed opposite to the array substrate, and a liquid crystal layer disposed between the array substrate and the color filter substrate. The array substrate includes a driving circuit, a source lead and a scan line driven by the driving circuit. The driving circuit includes a control switch, the control switch including a thin film transistor. The thin film transistor includes a source electrode, a drain electrode and a gate electrode. The source electrode includes at least two source branches arranged in parallel, and a source trunk connecting the at least two source branches together, where the source branch directly connected to the source lead is a first source branch, and the first source branch is connected to an end of the source trunk. The drain electrode is arranged in the same layer as the source electrode, and includes at least one drain branch and a drain trunk connecting the at least one drain branch. The at least one drain branch and the at least two source branches are arranged in parallel and alternately to form channels, and the drain branch arranged adjacent to the first source branch is a first drain branch. The gate electrode is arranged corresponding to the source electrode and the drain electrode. The extension line of the source lead is located between the first drain branch and the source trunk.

The present application improves the thin film transistor and the source lead in the driving circuit, so that the extension line of the source lead is located between the first drain branch and the source trunk, and does not overlap with the drain branch. When etching the film layer where the source electrode, the drain electrode and the source electrode lead are located, even if there is a problem of uneven etching, which causes the top of the source electrode lead to protrude from the first source branch, its protruding position will at most extend to between the first drain branch and the source truck, and does not intersect the first drain branch, so it will not cause a short circuit between the source electrode and the drain electrode.

BRIEF DESCRIPTION OF DRAWINGS

The accompanying drawings, which are included to provide a further understanding of the embodiments of the present application, constitute a part of the specification, are used to illustrate the embodiments of the present application, and together with the written description, serve to explain the principles of the present application. Obviously, the drawings used in the following description merely depict some embodiments of the present application, and for those having ordinary skill in the art, other drawings can also be obtained from these drawings without investing creative effort. In the drawings.

DETAILED DESCRIPTION OF EMBODIMENTS

Figure 1:
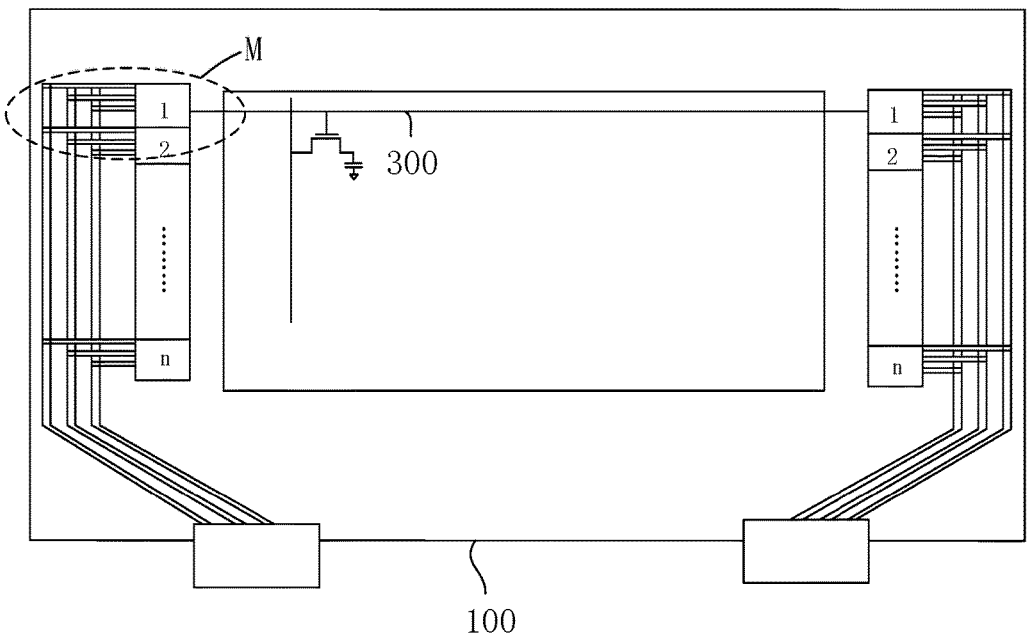
FIG. 1 is a schematic plan view of an array substrate.

It should be understood that the terminology used herein, the specific structural and functional details disclosed are intended for the mere purpose of describing specific embodiments and are representative, but the present application may be embodied in many alternative forms and should not be construed as limited only the embodiments set forth herein.

In the description of this application, the terms "first" and "second" are merely used for description purposes, and cannot be understood as indicating relative importance, or implicitly indicating the number of indicated technical features. Thus, unless otherwise specified, features defined as "first" and "second" may expressly or implicitly include one or more of the features; "plurality" means two or more. The terms "including", "comprising", and any variations thereof are intended to mean a non-exclusive inclusion, namely one or more other features, integers, steps, operations, units, components and/or combinations thereof may be present or added.

In addition, terms such as "center", "transverse", "lateral", "above", "on", "under", "below", "left", "right", "vertical", "horizontal", "top", "bottom", "inside", "outside", etc., indicative of orientations or positional relationships are described based on the orientations or relative positional relationships illustrated in the drawings, and are intended for the mere purpose of convenience of simplified description of the present application, rather than indicating that the device or element referred to must have a specific orientation or be constructed, and operate in a particular orientation. Thus, these terms should not be construed as limiting the present application.

In addition, unless otherwise expressly specified and defined, terms "installed on", "connected to", and "coupled to" should be understood in a broad sense. For example, it may be a fixed connection, a detachable connection, or an integral connection; it may be a mechanical connection, or may also be an electrical connection; it may be a direct connection, an indirect connection through an intermediate medium, or an internal connection between two components. For those having ordinary skill in the art, the specific meanings of the above terms in this application can be understood depending on specific contexts.

The present application will be described in detail below with reference to the accompanying drawings and optional embodiments. It should be noted that, should no conflict be present, the embodiments or technical features described below can be arbitrarily combined to form new embodiments.

Figure 2:
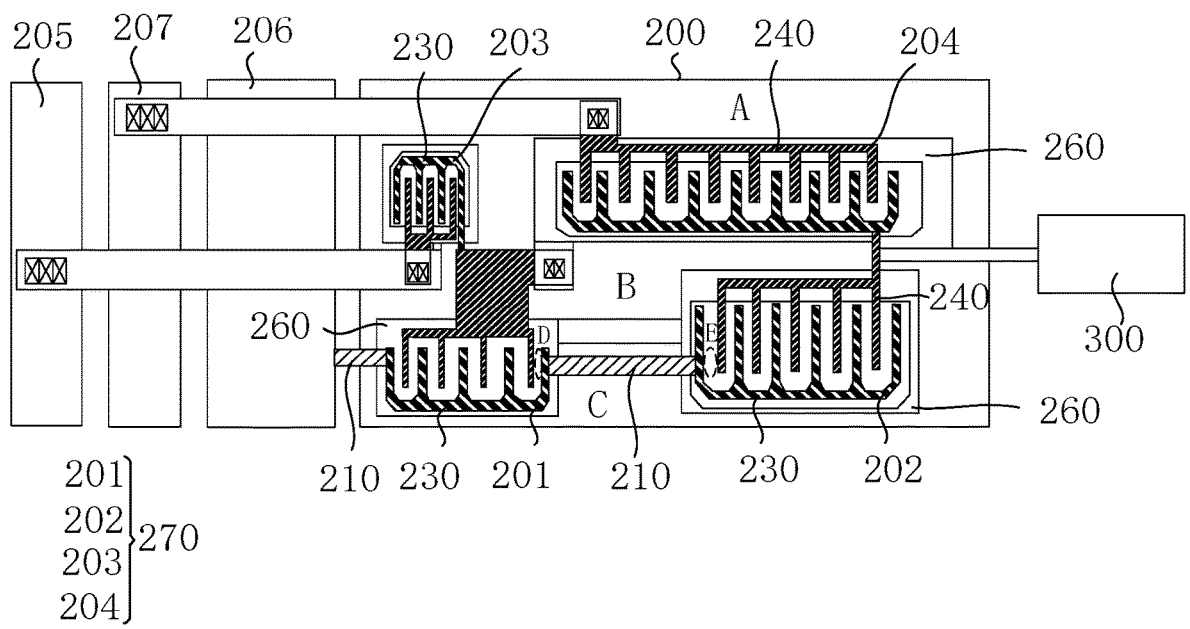
FIG. 2 is a partial enlarged view of portion M shown in FIG. 1.

FIGS. 1 and 2 show schematic plan views of an array substrate. A scan line 300 is disposed in a display area of the array substrate 100, and a driving circuit 200 is disposed in a non-display area of the array substrate 100, which may specifically be an array substrate gate driving circuit. The driving circuit 200 includes a frame start signal line 205 (STV), a gate voltage control line 206 (VGL), a clock signal line 207 (CKV) and a plurality of gate driving units 270. The input ends of the gate driving unit 270 are respectively connected to STV, VGL and CKV, and the output end of the gate driving circuit 270 is connected to the scan line 300 to drive the scan line 300.

In particular, the gate driving unit 270 includes a first thin film transistor 201, a second thin film transistor 202, a third thin film transistor 203 and a fourth thin film transistor 204. The source electrode 230 of the first thin film transistor 201 is connected to the gate voltage control line 206 and to the source electrode 230 of the second thin film transistor 202 through two source leads 210, respectively. The drain electrode 240 of the first thin film transistor 201 is connected to the source electrode 230 of the third thin film transistor 203 and to the gate electrode 260 of the fourth thin film transistor 204, and the gate electrode 260 of the first thin film transistor 201 is connected to the gate 260 of the second thin film transistor 202. The drain electrode 240 of the second thin film transistor 202 is connected to the source electrode 230 of the fourth thin film transistor 204, and the gate electrode 260 of the second thin film transistor 202 is connected to the gate electrode 260 of the fourth thin film transistor 204. The drain 240 of the third thin film transistor 203 is connected to the frame start signal line 205. The drain 240 of the fourth thin film transistor 204 is connected to the clock signal line 207.

In the gate driving unit 270 shown in FIG. 2, there are four thin film transistors connected to each other and other wirings. It can be seen in FIG. that there are three blank areas, namely area A, area B and area C, between area B and area C, two thin film transistors 220 are connected through a source lead 210. Before the metal layer is etched into the source electrode 230, the drain electrode 240 and other metal line patterns, an etching stop layer needs to be formed on the source electrode 230, the drain electrode 240 and other metal line patterns, and then a developer is used to form the stop layer pattern. Since the area B and the area C are relatively large, more developer needs to be consumed, so that the developing energy consumed by the area D and the area E is reduced, and so the stop layers corresponding to the area D and the area E cannot be easily completely etched, hence the problem of uneven etching occurs when etching the metal layer pattern, resulting in the short circuit of the source electrode 230 and the drain electrode 240 at the region D and the region E.

Figure 3:
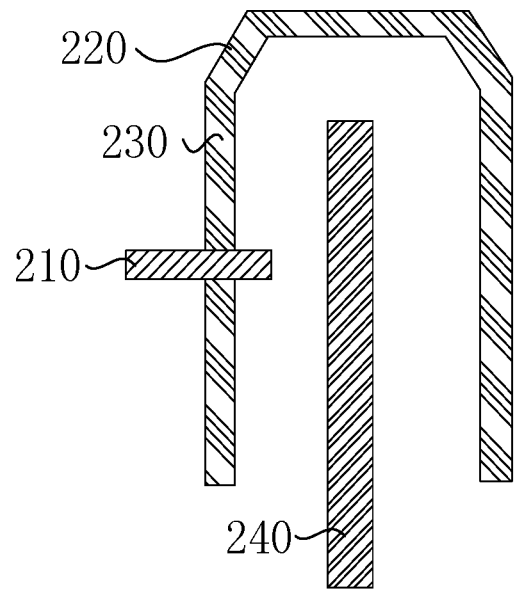
FIG. 3 is a partial schematic diagram of a gate driving unit.
Figure 4:
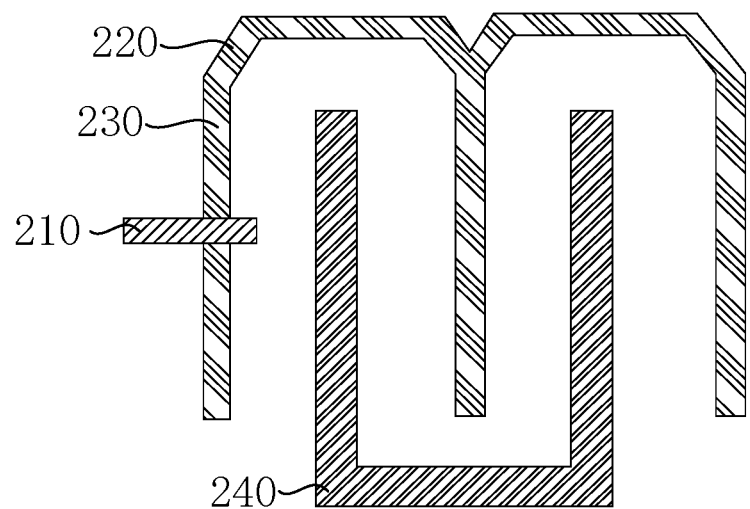
FIG. 4 is a partial schematic diagram of another gate driving unit.

FIGS. 3 and 4 show partial schematic diagrams of two exemplary GOAs. When the metal patterns corresponding to the regions D and E are not uniformly etched, the source leads 210 in FIGS. 3 and 4 will extend into the channel of the source 230 of the thin film transistor 220, or even connect with the drain electrode 240, resulting in a short circuit between the source electrode 230 and the drain electrode 240.

Figure 5:
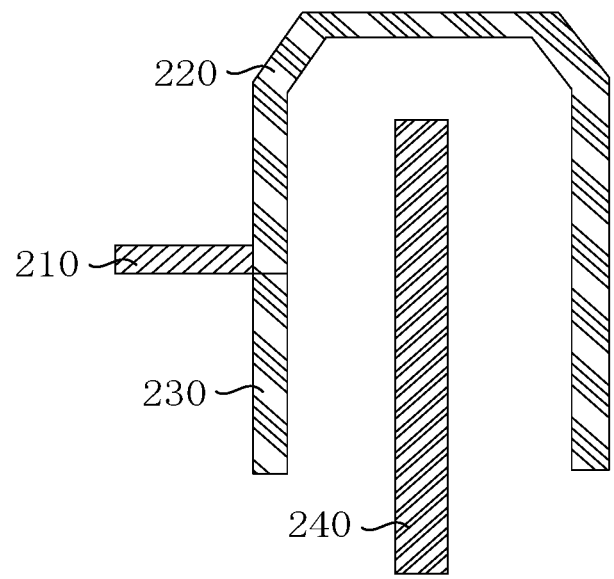
FIG. 5 is a schematic diagram based on FIG. 3 in an ideal state.
Figure 6:
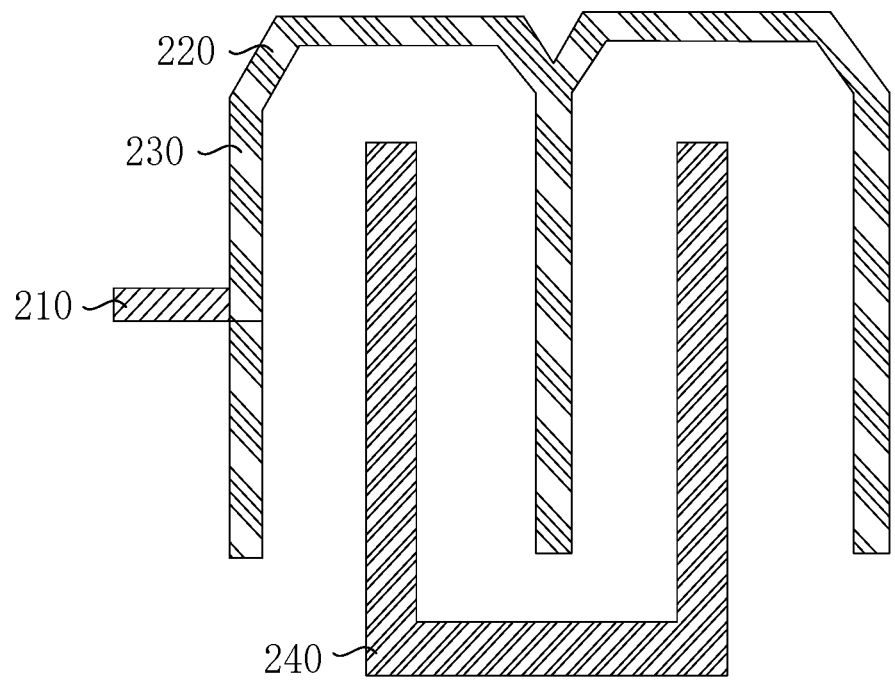
FIG. 6 is a schematic diagram based on FIG. 4 in an ideal state.

FIGS. 5 and 6 are schematic diagrams respectively based on FIGS. 3 and 4 under ideal conditions, but they needs to consume a lot of developer to ensure that the stop layers corresponding to the regions D and E are completely etched, so that when the metal pattern is subsequently etched, the source lead 210 does not protrude from the source electrode 230 and extend into the channel of the source electrode 230.

In view of this, the present application provides a control switch of a driving circuit 200 that does not cause a short circuit between the source electrode 230 and the drain electrode 240 even when the etching is uneven. As illustrated in FIGS. 1, 2, 7 to 11, the control switch includes a thin film transistor 220, and the driving circuit 200 further includes a source lead 210 connected to the thin film transistor 220. The thin film transistor 220 includes a source electrode 230, a drain electrode 240 and a gate electrode 260. The source electrode 230 includes at least two source branches 231 arranged in parallel, and a source trunk 234 connecting the at least two source branches 231. The drain electrode 240 is disposed in the same layer as the source electrode 230, and includes at least one drain branch 241, and a drain trunk 244 connecting the at least one drain branch 241 together, where the source branch 231 directly connected to the source lead 210 is a first source branch 232, and the first source branch 232 is connected to an end of the source trunk 234. The at least one drain branch 241 and the at least two source branches 231 are arranged in parallel and alternately to form channels. In particular, the drain branch 241 disposed adjacent to the first source branch 232 is the first drain branch 242, the gate 260 is disposed corresponding to the source 230 and the drain 240, and where the extension line of the source lead 210 is located between the first drain branch 242 and the source trunk 234.

It should be noted that when there is only one drain branch 241, then the drain trunk 244 is a part of the drain branch 241 and is connected to other structures in the driving circuit 200. Moreover, the gate electrode 260 may be located under the source electrode 230 and the drain electrode 240 to form a bottom gate structure in the thin film transistor 220, and the gate electrode 260 may also alternatively be located above the source electrode 230 and the drain electrode 240 to form a top gate structure in the thin film transistor 220.

Currently, the source lead 210 is generally connected vertically to the first source branch 232. Due to higher and higher requirements for the integration of the driving circuit 200, the channel spacing between the source electrode 230 and the drain electrode 240 becomes smaller and smaller. When the metal film layer where the source electrode 230, the drain electrode 240 and the source electrode branch 231 are located is not etched uniformly due to various reasons, for example, in FIG. 2, due to the large blank areas of regions B and C, more etching solution needs to be consumed, so that the etching solution in regions D and E is insufficient, resulting in the problem of uneven etching of the metal patterns in the regions D and E. At this time, the end of the source lead 210 is not etched cleanly, resulting in the end of the source lead 210 protruding from the first source branch 232. Since the channel distance between the source 230 and the drain 240 is small, it is easy to connect the source electrode lead 210 to the drain electrode 240, so that the source electrode 230 and the drain electrode 240 are short-circuited. Moreover, in the current design, since the width dimension of the source lead 210 is generally large to increase the charging effect on the thin film transistor 220, the source lead 210 is more susceptible to the influence of uneven etching, and the protruding area from the first source branch 232 is large, increasing the risk of a short circuit between the source 230 and the drain 240.

The present application improves the thin film transistor 220 and the source lead 210 in the driving circuit 200, so that the extension line of the source lead 210 is located between the first drain branch 242 and the source trunk 234, and does not overlap the drain branch 241. When the film layer where the source electrode 230, the drain electrode 240 and the source electrode lead 210 are located is etched, even if there is a problem of uneven etching so that the top of the source electrode lead 210 protrudes from the first source branch 232, the protruding position will at most extend between the first drain branch 242 and the source trunk 234, and will not intersect the first drain branch 242, so it will not cause a short circuit between the source 230 and the drain 240. In this solution, the channel width between the source electrode 230 and the drain electrode 240 and the width of the source lead 210 are not limited. Therefore, the driving circuit 200 can be made to meet the advantages of high integration, high charging effect, and resistance to short circuit at the same time, thereby improving the competitiveness among products of the same type.

Figure 7:
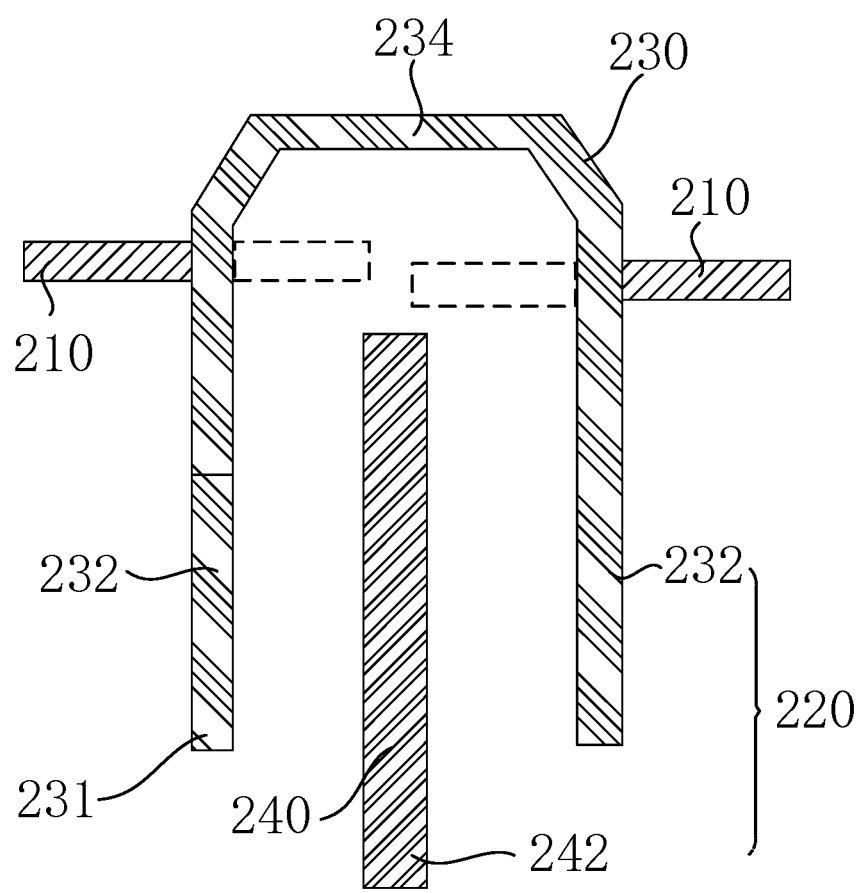
FIG. 7 is a partial schematic diagram of a driving circuit including a first type of thin film transistor provided by an embodiment of the present application.
Figure 8:
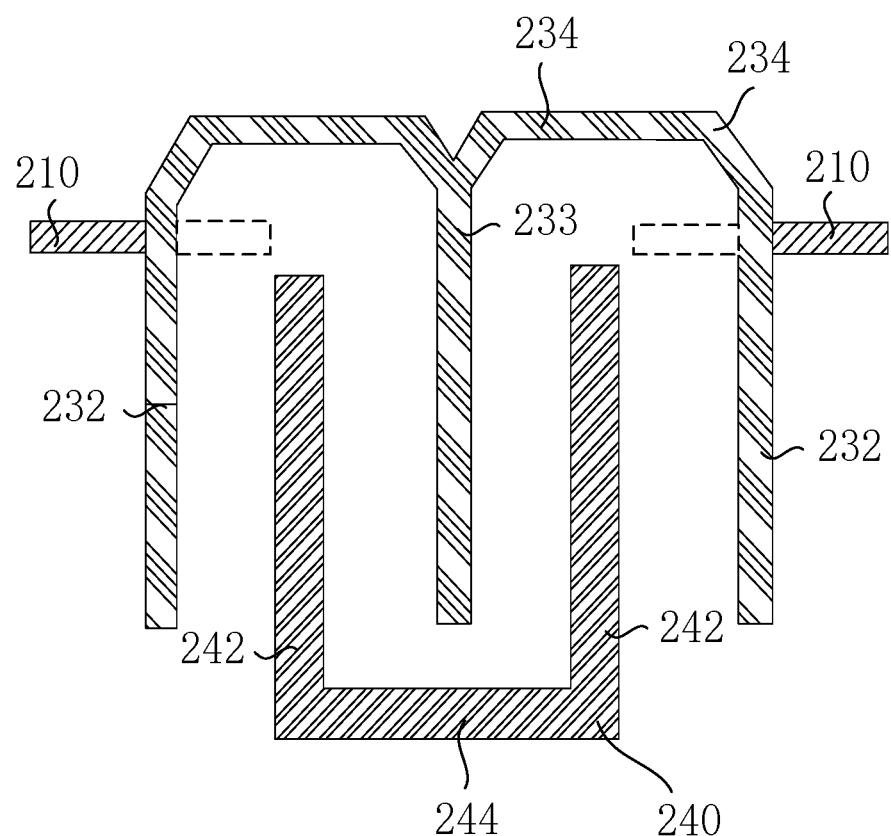
FIG. 8 is a partial schematic diagram of a driving circuit including a second type of thin film transistor provided by an embodiment of the present application.
Figure 9:
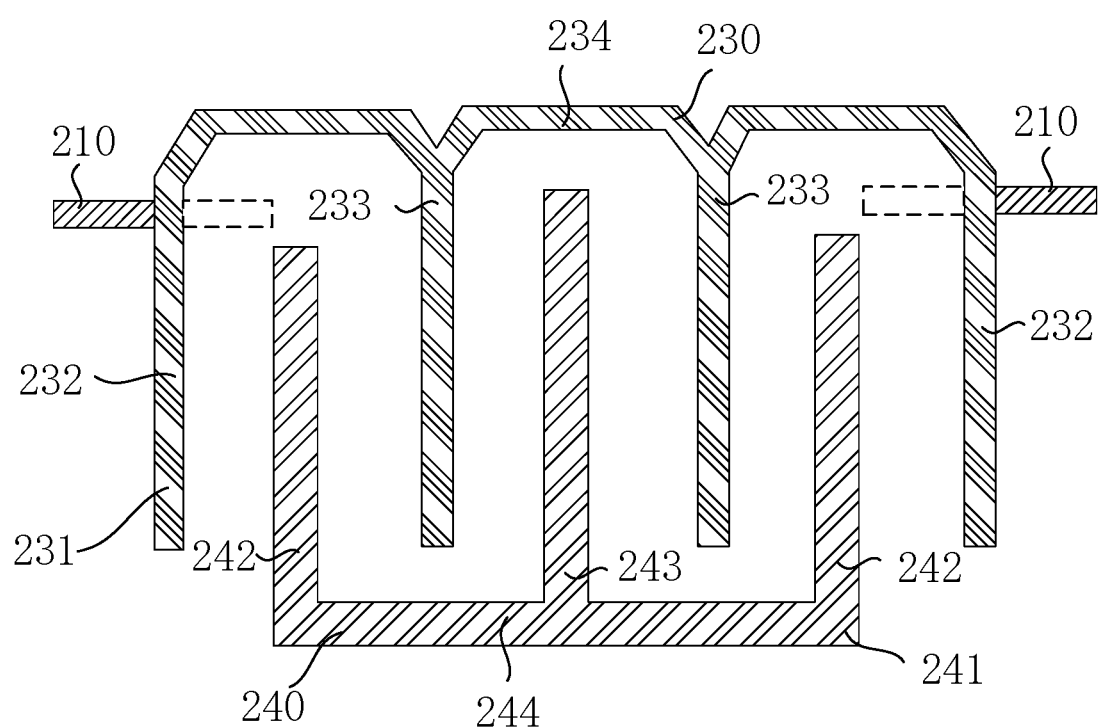
FIG. 9 is a partial schematic diagram of a driving circuit including a third type of thin film transistors provided by an embodiment of the present application.
Figure 10:
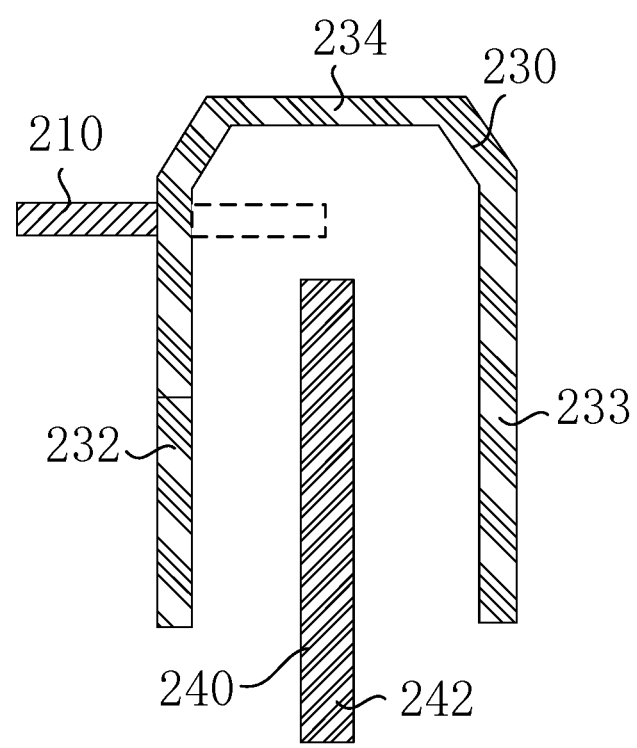
FIG. 10 is a partial schematic diagram of a driving circuit including the first type of thin film transistor provided by another embodiment of the present application.
Figure 11:
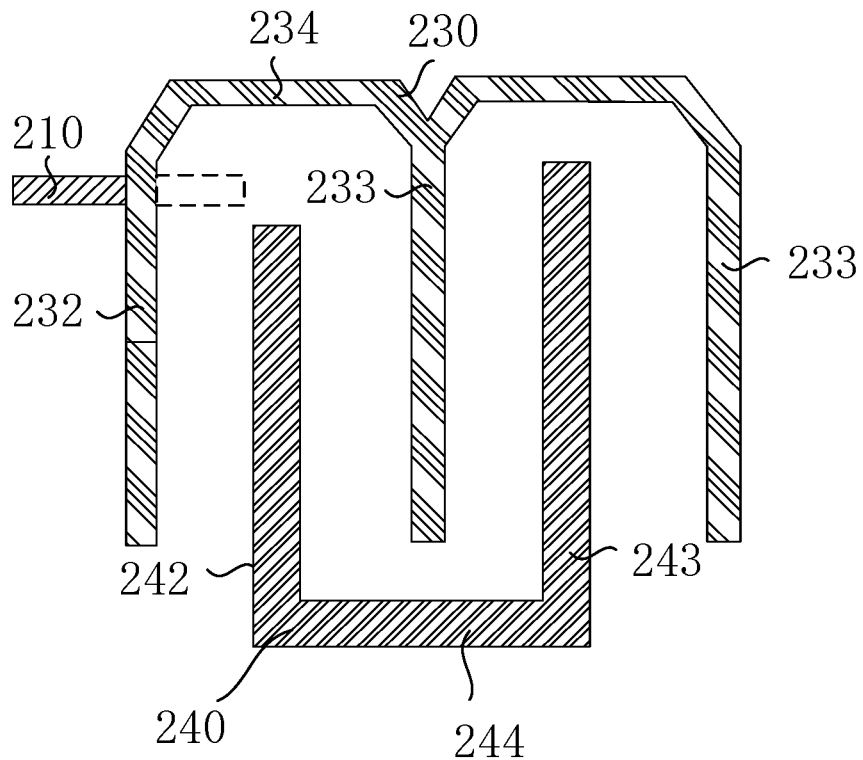
FIG. 11 is a partial schematic diagram of a driving circuit including the second type of thin film transistor provided by another embodiment of the present application.

In FIGS. 7 to 9, one thin film transistor 220 is connected to two source leads 210 at the same time. In this case, there are two first source branches 232 and at least one first drain branch 242. In FIGS. 10-11, one thin film transistor 220 is only connected to one source lead 210. At this time, there is only one first source branch 232, at least one second source branch 233, and only one first drain branch 242. These two connection situations can be applied to one driving circuit 200 or to different driving circuits 200, which can be specifically designed depending on usage conditions.

As shown in FIG. 7, the source electrode 230 has only two first source branches 232 connected to the source leads 210 in one-to-one correspondence, and a source trunk 234 connecting the two first source branches 232 together. The drain electrode 240 has only one first drain branch 242, and the first drain branch 242 is located between the two first source branches 232. The two first source branches 232 are each between the first drain branch 242 and the source truck 234 while not overlapping the first drain branch 242. The thin film transistor 220 adopts the simplest dual-channel structure, the shape of the source electrode 230 is similar to a U-shape, and two channels are formed between the first drain branch 242 and the two first source branches 232. Since the two source leads 210 are compared and distinguished with the same first drain branch 242 as long as they are not in contact with the first drain branch 242, the design of the etching pattern is simple.

As shown in FIG. 8, the source electrode 230 includes two first source electrode branches 232, one second source electrode branch 233 and one source electrode trunk 234 at this time. The two first source branches 232 are respectively connected to both ends of the source trunk 234, and are respectively connected to the two source leads 210 in one-to-one correspondence. The second source branch 233 is arranged in parallel between the two first source branches 232, and is connected to the middle of the source trunk 234. The drain 240 includes two first drain branches 242 and a drain trunk 244. The two first drain branches 242 are respectively connected to two ends of the drain trunk 244. Each drain branch 241 is located between two adjacent first source branch 232 and second source branch 233. In this embodiment, the shape of the source electrode 230 is similar to the W-shape, and the shape of the drain electrode 240 is similar to the U-shape. Each source lead 210 may extend in the region formed between the first source branch 232 and the adjacent second source branch 233 without contacting other structures. Therefore, when the problem of uneven etching is serious, there is enough fault tolerance space to prevent the source lead 210 from being extended too long to cause the source 230 and the drain 240 to be short-circuited.

As shown in FIG. 9, at this time, the source electrode 230 includes two first source electrode branches 232, two second source electrode branches 233 and a source electrode trunk 234. The two first source branches 232 are respectively connected to both ends of the source trunk 234, and are respectively connected to the two source leads 210 in a one-to-one correspondence. The two second source branches 233 are arranged in parallel between the two first source branches 232, and are connected to the source trunk 234. The drain 240 includes two first drain branches 242, a second drain branch 243 and a drain trunk 244. The two first drain branches 242 are respectively connected to two ends of the drain trunk 244. The second drain branch 243 is arranged in parallel between the two first drain branches 242, and is connected to the middle of the drain trunk 244. Each of the first drain branches 242 is located between two adjacent first source branch 232 and second source branch 233. The second drain branch 243 is located between two adjacent second source branches 233. In this embodiment, the shape of the source electrode 230 is similar to three parallel U-shaped structures, and the shape of the drain electrode 240 is similar to the W-shaped structure. Compared with FIGS. 7 and 8, the electrical performance of the thin film transistor 220 in FIG. 9 is better. Of course, the present application can also continue to increase the number of the second source branches 233 and the second drain branches 243 on the basis of FIG. 9, so that the electrical performance of the thin film transistor 220 can be further improved.

As shown in FIG. 10, the source electrode 230 has only one first source branch 232 connected to the source lead 210, one second source branch 233 not connected to the source lead 210, and one source truck 234 connecting the first source branch 232 and the second source branch 233 together. The drain 240 has only one first drain branch 242, and the first drain branch 242 is arranged in parallel between the first source branch 232 and the second source branch 233, and the first drain branch 242 forms two channels with the first source branch 232 and the second source branch 233 respectively. In this embodiment, the thin film transistor 220 is also the simplest dual-channel type, but the difference from FIG. 7 is that since the thin film transistor in FIG. 10 is only connected to one source lead 210, the source lead has a larger extension space, and it is not easy to short-circuit with other structures.

As shown in FIG. 11, the drain electrode 240 includes one first source branch 232 connected to the source lead 210, two second source branches 233 not connected to a source lead 210, and a source trunk 234 connecting the first source branch 232 and the second source branch 233 together. One of the second source branches 233 and the first source branch 232 are connected to both ends of the source trunk 234, and the other second source branch 233 is connected to the middle of the source trunk 234. The drain 240 includes a first drain branch 242, a second drain branch 243 and a drain trunk 244. The first drain branch 242 and the second drain branch 243 are respectively connected to both ends of the drain trunk 244. The first drain branches 242 are arranged in parallel between the adjacent first source branch 232 and second source branch 233. The second drain branch 243 is arranged in parallel between two adjacent second source branches 233. In order to further increase the electrical performance of the thin film transistor 220, the number of the second source branches 233 and the second drain branches 243 may be further increased on the basis of FIG. 11.

In the present application, the distance between the first drain branch 242 and the source trunk 234 can be increased by shortening the length of the first drain branch 242, so that the extension line of the source lead 210 can be made between the first drain branch 242 and the source trunk 234, and does not overlap the first drain branch 242. It is also possible to reduce the width of the source lead 210, so that when the extension line of the source lead 210 is between the first drain branch 242 and the source trunk 234, the extension line of the source lead 210 does not overlap the first drain branch 242. It is also possible to reduce the width of the source trunk 234, so that when the extension line of the source lead 210 is between the first drain branch 242 and the source trunk 234, the extension line of the source lead 210 does not overlap the first drain branch 242. The same technical effect can also be achieved by a combination of two or more of the above methods.

In FIGS. 7 to 11, the distance between the first drain branch 242 and the source stem 234 is increased by shortening the length of the first drain branch 242. This method will not affect the charging effect of the source lead 210, nor will it affect the electrical uniformity effects of the source electrode 230 and the drain electrode 240. Moreover, compared with other methods, this method can arbitrarily control the length of the drain 240. Since the length of the drain electrode 240 is relatively large, the distance between the first drain branch 242 and the source electrode stem 234 can be made relatively large. In FIG. 9 and FIG. 11, the length of the second drain branch 243 does not need to be changed, and the distance between the second drain branch 243 and the source truck 234 is smaller than the distance between the first drain branch 242 and the source trunk 234. Such a design makes the channel distance between the source electrode 230 and the drain electrode 240 not greatly affected although the length of the first drain branch 242 is reduced, and the influence on the thin film transistor 220 is small.

Specifically, the distance by which the first drain branch 242 is shortened can be equal to the width of the source lead 240, that is, the difference between the lengths of the second drain branch 243 and the first drain branch 242 is equal to the width of the source lead 210. The length direction of the first drain branch 242 and the second drain branch 243 is the extension direction of the first drain branch 242 and the second drain branch 243. Such a close arrangement makes full use of the blank area between the first drain branch 242 and the source truck 234, which is beneficial to reduce the volume of the thin film transistor 220. Furthermore, the second drain branch 243 is flush with the top of the source lead 210 (the side close to the source trunk), which facilitates the alignment design when making the pattern, thereby reducing the etching difficulty of etching the barrier pattern and improving the uniform effect of etching the metal layer where the source electrode 230, the drain electrode 240 and the source electrode lead 210 are located.

Moreover, when the thin film transistor 220 is connected with the two source leads 210, the two source leads 210 can be arranged on the same straight line, so that the shortened distances of the two first drain branches 242 can be the same, which not only facilitates improving the uniformity of the source 230 and the drain 240 at both ends of the thin film transistor 220, but also maximize the lengths of the two first drain branches 242 to avoid that one first drain branch 242 is long and the other first drain branch 242 is short, which would otherwise reduce the electrical performance of the thin film transistor 220. Of course, the two source leads 210 may not be arranged on the same straight line, so as to prevent the two source leads 210 from being short-circuited, resulting in the risk of a short circuit.

In this application, all source branches 231 and drain branches 241 are strip-shaped structures, which can be rectangular, oval or other shapes. The extension direction of the source branch 231 and the extension direction of the source trunk 234 are perpendicular to each other, and the extension direction of the drain branch 241 and the extension direction of the drain trunk 244 are also perpendicular to each other. However, the extension direction of the source branch 231 and the extension direction of the source trunk 234 may form an acute angle, and the extension direction of the drain branch 241 and the extension direction of the drain trunk 244 may also form an acute angle. The source lead 210 and the first source branch 232 may be arranged vertically or obliquely with respect to each other.

Moreover, the widths of the source branches 231, the source trunk 234, the drain branches 241 and the drain trunk 244 are all equal, and the channel widths between the second source branches 233 and the adjacent drain branches 241 are also equal, thereby increasing the conductivity of the thin film transistor 220. Since the present application only needs to reduce the length of the first drain branch 242 to overcome the short circuit between the source electrode 230 and the drain electrode 240 caused by uneven etching, the channel width between the source branch 231 and the drain branch 241 can be further reduced, the distance between the second drain branch 243 and the source trunk 234 can be further reduced, and the distance between the source trunk 234 and the drain trunk 244 can be further reduced, so as to further improve the integration degree in the driving circuit 200, reduce the occupied area of the driving circuit 200 in the display panel, and further reduce the narrow bezel of the display panel.

Figure 12:
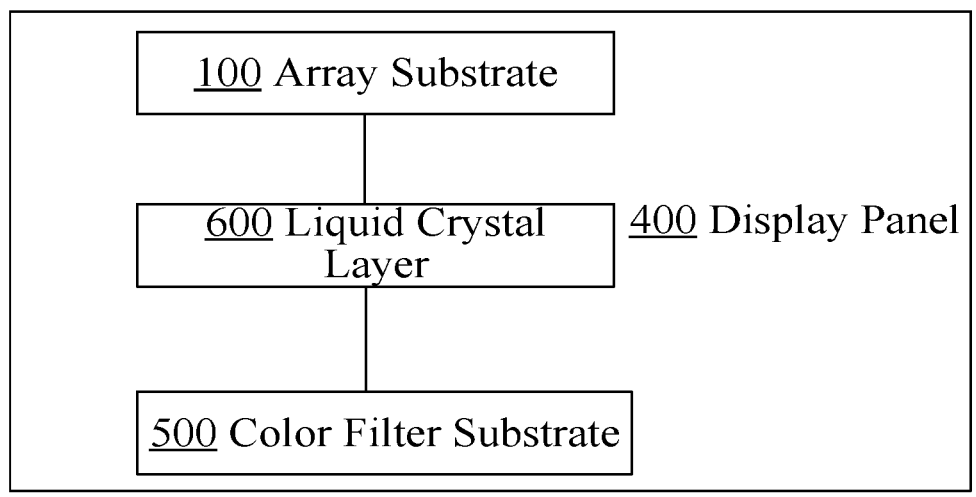
FIG. 12 is a schematic diagram of a display panel according to an embodiment of the present application.

FIG. 12 shows a schematic diagram of a display panel. As another embodiment of the present application, a display panel 400 is further disclosed. The display panel 400 includes the array substrate 100 illustrated in FIG. 1, a color filter substrate 500 disposed opposite to the array substrate 100, and a liquid crystal layer 600 disposed between the array substrate 100 and the color filter substrate 500. The non-display area of the array substrate 100 includes the above-mentioned driving circuit 200. In addition, the thin film transistor 220 in the present application is not only applicable to the row driving circuit of the array substrate in the non-display area, but also applicable to the active switches in the display area of the array substrate 100.

The technical solutions of the present application may be widely used in various display panels, such as TN (Twisted Nematic) display panels, IPS (In-Plane Switching) display panels, VA (Vertical Alignment) display panels, and MVA (Multi-Domain Vertical Alignment) display panels. Of course, the above solutions are also applicable to other types of display panels.

It should be noted that the inventive concept of the present application can form a large number of embodiments, but they cannot be enumerated because the length of the application document is limited. The technical features as set forth herein can be arbitrarily combined to form a new embodiment, and the original technical effects may be enhanced after various embodiments or technical features are combined.

The foregoing is a further detailed description of the present application in conjunction with specific optional embodiments, but it should not be construed as that the specific implementation of the present application will be limited to these descriptions. For those having ordinary skill in the technical field of the present application, without departing from the scope and spirit of the present application, some simple deductions or substitutions can be made, which should all be regarded as falling in the scope of protection of the present application.

What is claimed is:

1. A control switch of a driving circuit, the control switch comprising a thin film transistor, the driving circuit further comprising at least one source lead connected to the thin film transistor, wherein the thin film transistor comprises:
   a source electrode, comprising at least two source branches that are arranged in parallel, and a source trunk connecting the at least two source branches together, wherein each source branch directly connected to the at least one source lead is a first source branch, and wherein the first source branch is connected to an end of the source trunk;
   a drain electrode, disposed in a same layer as the source electrode, comprising at least one drain branch and a drain trunk connecting the at least one drain branch together, wherein the at least one drain branch and the at least two source branches are arranged in parallel and alternately to form channels, and wherein each drain branch disposed adjacent to each first source branch is a first drain branch; and
   a gate electrode, disposed corresponding to the source electrode and the drain electrode;
   wherein an extension line of each of the at least one source lead is located between the respective first drain branch and the source trunk and doesn't overlap the respective first drain branch, wherein the extension line of each of the at least one source lead has a width equal to a width of the respective source lead, and wherein the extension line of each of the at least one source lead is collinear and aligned with the respective source lead;

wherein the thin film transistor is connected to two said source leads, wherein a number of the first source branches is two, and wherein the two first source branches are respectively connected to both ends of the source trunk and are connected to the two source leads in one-to-one correspondence;

wherein each first drain branch is disposed between the two first source branches, and wherein an extension line of each of the two source leads is located between the respective first drain branch and the source trunk and does not overlap the respective first drain branch;

wherein each source branch not directly connected to the at least one source lead is a second source branch, and wherein the second source branch is arranged in parallel between the two first source branches, and is connected to the source trunk;

wherein each drain branch not disposed adjacent to the first source branch is a second drain branch, wherein a number of the first drain branches is two, and the two first drain branches are respectively connected to two ends of the drain trunk, wherein the second drain branch is arranged in parallel between the two first drain branches, and is connected to the drain trunk;

wherein each first drain branch is arranged between the respective first source branch and the respective second source branch that are adjacent to each other, and the second drain branch is arranged between two adjacent second source branches;

wherein a distance between the second drain branch and the source trunk is less than a distance between each first drain branch and the source trunk.

2. The control switch of claim 1, wherein when there is only one second source branch, the number of the second drain branches is zero, and wherein the source electrode is W-shaped, and the drain electrode is U-shaped.

3. The control switch of claim 1, wherein the source electrode comprises two first source branches, two second source branches, and one source trunk; wherein the drain electrode comprises two first drain branches, one second drain branch, and one drain trunk; wherein each first drain branch is located between the respective first source branch and the respective second source branch that are adjacent to each other; and wherein the second drain branch is located between the two adjacent second source branches.

4. The control switch of claim 1, wherein when the number of the first drain branches is only one, the source is U-shape.

5. The control switch of claim 1, wherein the two source leads are located on a same straight line.

6. The control switch of claim 1, wherein the two source leads are not located on a same straight line.

7. The control switch of claim 1, wherein the at least two source branches and the at least one drain branch each have a strip, a rectangular or an ellipse shape.

8. The control switch of claim 1, wherein an extension direction of the at least two source branches and an extension direction of the source trunk are perpendicular to each other, and wherein an extension direction of the at least one drain branch and an extension of the drain trunk are perpendicular to each other.

9. The control switch of claim 1, wherein an extension direction of the at least two source branches and an extension direction of the source trunk form an acute angle, and wherein an extension direction of the at least one drain branch and an extension direction of the drain trunk form an acute angle.

10. The control switch of claim 1, wherein the at least two source branches, the source trunk, the at least one drain branch, and the drain trunk are all equal in width.

11. A display panel comprising an array substrate, a color filter substrate disposed opposite to the array substrate, and a liquid crystal layer disposed between the array substrate and the color filter substrate, the array substrate comprising a driving circuit, a source lead, and a scan line driven by the driving circuit, wherein the driving circuit comprises the control switch of claim 1.

12. An array substrate, comprising a driving circuit, a source lead, and a scan line driven by the driving circuit, wherein a control switch of the driving circuit comprises a thin film transistor, wherein the thin film transistor comprises:

a source electrode, comprising at least two source branches that are arranged in parallel, and a source trunk connecting the at least two source branches together, wherein each source branch directly connected to the at least one source lead is a first source branch, and wherein the first source branch is connected to an end of the source trunk;

a drain electrode, disposed in a same layer as the source electrode, comprising at least one drain branch and a drain trunk connecting the at least one drain branch together, wherein the at least one drain branch and the at least two source branches are arranged in parallel and alternately to form channels, and wherein each drain branch disposed adjacent to each first source branch is a first drain branch; and a gate electrode, disposed corresponding to the source electrode and the drain electrode;

wherein an extension line of each of the at least one source lead is located between the respective first drain branch and the source trunk and doesn't overlap the respective first drain branch, wherein the extension line of each of the at least one source lead has a width equal to a width of the respective source lead, and wherein the extension line of each of the at least one source lead is collinear and aligned with the respective source lead;

wherein the driving circuit comprises a frame start signal line, a gate voltage control line, a clock signal line and a plurality of gate driving units, wherein input ends of the gate driving unit are respectively connected to the frame start signal line, the gate voltage control line, and the clock signal line, and an output end of the gate drive unit is connected to the scan line to drive the scan line; the gate voltage control line is connected to a thin film transistor in the gate driving unit through the source lead;

wherein the gate driving unit comprises a first thin film transistor, a second thin film transistor, a third thin film transistor and a fourth thin film transistor; a source electrode of the first thin film transistor is directly connected to the gate voltage control line and directly connected to a source electrode of the second thin film transistor through two source leads, respectively, and a drain electrode of the first thin film transistor is directly connected to a source electrode of the third thin film transistor and directly connected to a gate electrode of the fourth thin film transistor, and a gate electrode of the first thin film transistor is directly connected to a gate electrode of the second thin film transistor; a drain electrode of the second thin film transistor is directly connected to a source electrode of the fourth thin film transistor, and a gate electrode of the second thin film transistor is directly connected to a gate electrode of the fourth thin film transistor; a drain electrode of the third thin film transistor is directly connected to the frame start signal line, and a drain electrode of the fourth thin film transistor is directly connected to the clock signal line.

13. A control switch of a driving circuit, the control switch comprising a thin film transistor, the driving circuit further comprising at least one source lead connected to the thin film transistor, wherein the thin film transistor comprises:

- a source electrode, comprising at least two source branches that are arranged in parallel, and a source trunk connecting the at least two source branches together, wherein each source branch directly connected to the at least one source lead is a first source branch, and wherein the first source branch is connected to an end of the source trunk;
- a drain electrode, disposed in a same layer as the source electrode, comprising at least one drain branch and a drain trunk connecting the at least one drain branch together, wherein the at least one drain branch and the at least two source branches are arranged in parallel and alternately to form channels, and wherein each drain branch disposed adjacent to each first source branch is a first drain branch; and
- a gate electrode, disposed corresponding to the source electrode and the drain electrode;
- wherein an extension line of each of the at least one source lead is located between the respective first drain branch and the source trunk and doesn't overlap the respective first drain branch, wherein the extension line of each of the at least one source lead has a width equal to a width of the respective source lead, and wherein the extension line of each of the at least one source lead is collinear and aligned with the respective source lead;
- wherein the thin film transistor is connected to one source lead, and there is only one first source branch; each source branch not directly connected to the source lead is a second source branch, and a number of the second source branches is at least one;
- wherein each first drain branch is disposed between the first source branch and the respective second source branch, and wherein an extension line of the source lead is located between the first drain branch and the source trunk and does not overlap the first drain branch;
- wherein each drain branch not disposed adjacent to the first source branch is a second drain branch, and wherein there is at least one second drain branch, wherein the first drain branch and one second drain branch are respectively connected to both ends of the drain trunk; wherein each second drain branch is arranged at between two adjacent second source branches;
- wherein a difference between a length of each second drain branch and a length of the first drain branch is equal to a width of the source lead;
- wherein a length direction of the first drain branch and each second drain branch is a direction of extension of the first drain branch and the second drain branch.

* * * * *